United States Patent [19]

Yoshikawa

[11] Patent Number: 4,929,988
[45] Date of Patent: May 29, 1990

[54] NON-VOLATILE SEMICONDUCTOR MEMORY DEVICE AND METHOD OF THE MANUFACTURE THEREOF

[75] Inventor: Kuniyoshi Yoshikawa, Tokyo, Japan

[73] Assignee: Kabushiki Kaisha Toshiba, Kawasaki, Japan

[21] Appl. No.: 235,121

[22] Filed: Aug. 23, 1988

[30] Foreign Application Priority Data

Aug. 25, 1987 [JP] Japan ................ 62-210774

[51] Int. Cl.$^5$ ............... H01L 29/78; H01L 29/34; H01L 29/06; H01L 23/48
[52] U.S. Cl. .................... 357/23.5; 357/49; 357/54; 357/55; 357/59; 357/71
[58] Field of Search .............. 357/23.5, 49, 54, 55, 357/59, 71, 67; 365/185

[56] References Cited

U.S. PATENT DOCUMENTS 4,698,900 10/1987 Esquivel .................. 357/54
4,786,953 11/1988 Morie et al. .............. 357/55

FOREIGN PATENT DOCUMENTS 0048175 3/1982 European Pat. Off. ........ 357/55
61-256673 11/1986 Japan ..................... 357/23.5

Primary Examiner—J. Carroll
Attorney, Agent, or Firm—Finnegan, Henderson, Farabow, Garrett and Dunner

[57] ABSTRACT

A groove is formed in a P well region to extend in a predetermined direction, and the groove is selectively filled with silicon dioxide layers so that the groove is separated into a plurality of groove portions. On each of opposed side walls of the groove portion along the direction of extension of the groove sequentially formed are a first gate insulating layer and a polysilicon layer serving as a floating gate electrode. Further, a second gate insulating layer and a polysilicon layer serving as a control gate electrode are sequentially formed on the polysilicon layer. N-type diffusion regions serving as source regions of MOS transistors are formed in the surface of the P well region, and further an N-type diffusion region serving as drain regions of the MOS transistors is formed in a surface region of the P well region that is located at the bottom of the groove portion.

7 Claims, 6 Drawing Sheets

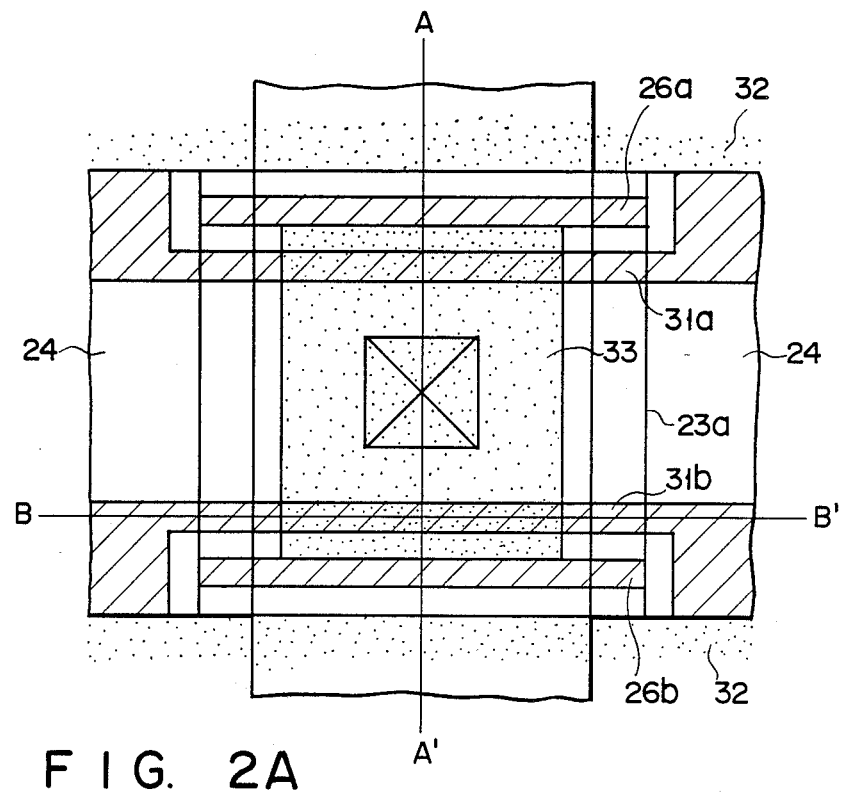
F I G. 2A

NON-VOLATILE SEMICONDUCTOR MEMORY DEVICE AND METHOD OF THE MANUFACTURE THEREOF

BACKGROUND OF THE INVENTION

1. Field of the Invention

The present invention relates to a non-volatile semiconductor memory device and a method of manufacture thereof.

2. Description of the Related Art

Memory cells used in a programmable read only memory (PROM), one type of non-volatile semiconductor memory device, are each formed of a non-volatile transistor for storing data and a transistor for selecting the memory cell.

FIG. 1 illustrates a sectional view of a non-volatile transistor used in memory cells of a conventional PROM. A field oxide layer 12 is formed over the surface of a P-type silicon substrate 11. An N+-type source region 13 and an N+-type drain region 14 are formed in the substrate to be surrounded by a field oxide layer 12. A first gate insulation layer 15, a floating gate electrode 16 of polysilicon, a second gate insulation layer 17 and a control gate electrode 18 of polysilicon are sequentially formed over a portion of the substrate between source region 13 and drain region 14.

With such a transistor as described above, high voltages are applied to gate electrode 18 and drain region 14 so that hot electrons are generated in the vicinity of the drain within a channel region between the source and drain regions, and the hot electrons are injected into floating gate electrode 16 and stored therein so that data is written into the memory cell.

To construct the PROM, a great number of non-volatile transistors as described above must be formed on the substrate. And, to realize a large-capacity memory, the dimensions of the non-volatile transistor in the longitudinal and horizontal directions thereof should be made very small. However, in conventional PROMs using non-volatile transistors having such a structure as shown in FIG. 1, simply decreasing the dimensions of each non-volatile transistor on a plane would degrade reliability and separation characteristics of transistors.

SUMMARY OF THE INVENTION

It is accordingly an object of the present invention to provide an improved non-volatile semiconductor memory device which enables non-volatile transistors to be made fine without degrading their reliability.

It is another object to provide a method of fabricating an improved non-volatile semiconductor memory device.

According to a first aspect of the present invention there is provided a non-volatile memory device comprising: a first semiconductor region of a first conductivity type; a groove formed in said first semiconductor region to extend in a predetermined direction; insulating separation regions formed to selectively fill the inside of said groove; a second semiconductor region of a second conductivity type formed in a surface of said first semiconductor region and serving as a source or drain region; a first gate insulating layer formed on a side wall of a groove portion defined by said insulating separation regions and said first semiconductor region, said side wall being along the direction of extension of said groove; a floating gate electrode formed on a surface of said gate first insulating layer opposite to a surface thereof contacting said side wall of said groove portion; a second gate insulating layer formed on a surface of said floating gate electrode opposite to a surface thereof contacting said first gate insulating layer; a control gate electrode formed on a surface of said second gate insulating layer opposite to a surface thereof contacting said floating gate electrode; a third semiconductor region of said second conductivity type formed in a surface region of said first semiconductor region that is located at the bottom of said groove portion and serving as a drain or source region; and a fourth semiconductor region formed within said groove portion to contact said third semiconductor region and doped with impurities of said second conductivity type.

According to a second aspect of the present invention there is provided a method of manufacturing a non-volatile memory device comprising the steps of: adding to a surface of a first semiconductor region of a first conductivity type impurities of a second type conductivity type to form a second semiconductor region; forming a groove in said first semiconductor region to extend in a predetermined direction by an anisotropic etching technique using a predetermined mask; filling said groove with an insulating separation layer; selectively removing said insulating separation layer by an isotropic etching technique using a predetermined mask to separate said groove into a plurality of groove portions; sequentially forming a first silicon dioxide layer, a first polysilicon layer, a second silicon dioxide layer and a silicon nitride layer over an entire surface including inside surfaces of said groove portion defined by said insulating separation layer and said first semiconductor region; selectively etching said first silicon dioxide layer, said first polysilicon layer, said second silicon dioxide layer and said silicon nitride layer to leave first silicon dioxide layers, first polysilicon layers, second silicon dioxide layers and silicon nitride layers on opposed side walls of said groove portion; forming third silicon dioxide layers on exposed portions of said first polysilicon layers, and fourth silicon dioxide layers on surfaces of silicon nitride layers by heating oxidization techniques; depositing a second polysilicon layer over the entire surface; selectively etching said second polysilicon layer by an anisotropic etching technique using a predetermined mask to leave second polysilicon layers on surfaces of said fourth silicon dioxide layers; forming fifth silicon dioxide layers on said second polysilicon layers and on exposed portions of said first and second semiconductor regions; selectively etching said fifth silicon dioxide layers to exposed said first semiconductor region that is located at the bottom of said groove portion; depositing a third polysilicon layer over the entire surface after oxidization of the entire surface; selectively etching said third polysilicon layer by an anisotropic etching technique to leave a third polysilicon layer at least within said groove portion; and adding impurities of said second conductivity type to said first semiconductor region through said third polysilicon layer to form a third semiconductor region in a surface region of said first semiconductor region that is located at the bottom of said groove portion.

With the non-volatile memory device of the present invention, a non-volatile transistor is formed vertically by forming a floating gate electrode and a control gate electrode of a non-volatile transistor on a side wall of a groove formed in a first semiconductor region, forming a source or drain region of the transistor in a surface of the first semiconductor region, and forming a drain or source region of the transistor at the bottom of the groove. As a result, separation characteristics between the source and drain of transistors can be improved, fine transistors can be made, and a substantial reduction in the occupied area of a transistor can be attained.

BRIEF DESCRIPTION OF THE DRAWINGS

FIG. 2A shows a pattern layout of a transistor of a non-volatile semiconductor memory device according to an embodiment of the present invention;

DETAILED DESCRIPTION OF THE PREFERRED EMBODIMENTS

Figure 1:
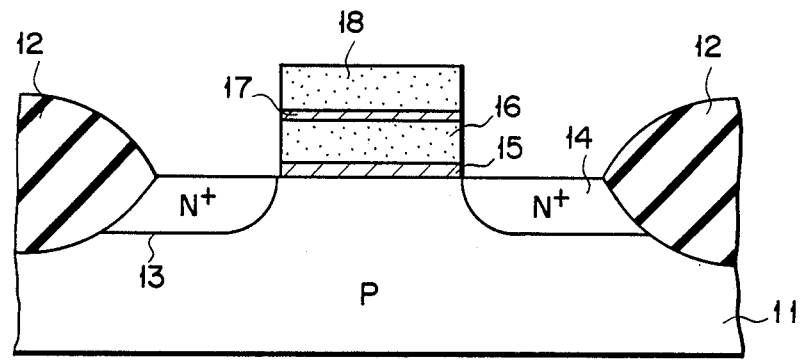
FIG. 1 is a sectional view of a non-volatile transistor used in a conventional non-volatile semiconductor memory device.
Figure 2B:
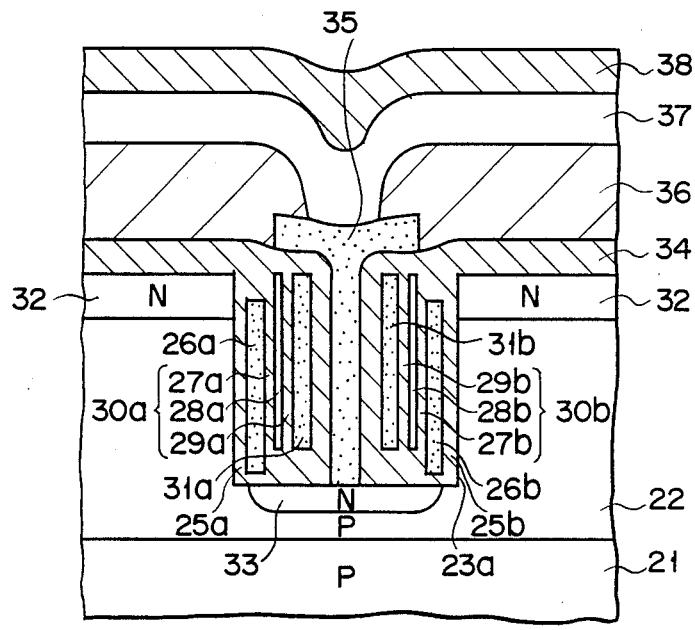
FIG. 2B is a sectional view taken along line A-A' line of FIG. 2A.
Figure 2C:
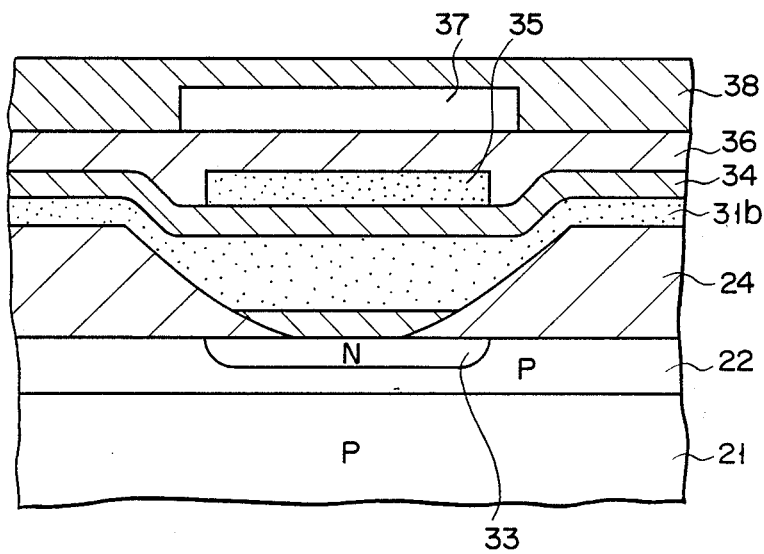
FIG. 2C is a sectional view taken along B-B' line of FIG. 2A.

FIG. 2A is a plan view or pattern layout showing a structure of a transistor used in a non-volatile semiconductor device according to the present invention, FIG. 2B is a sectional view taken along A-A' line of FIG. 2A, and FIG. 2C is a sectional view taken along B-B' line of FIG. 2A.

Figure 3:
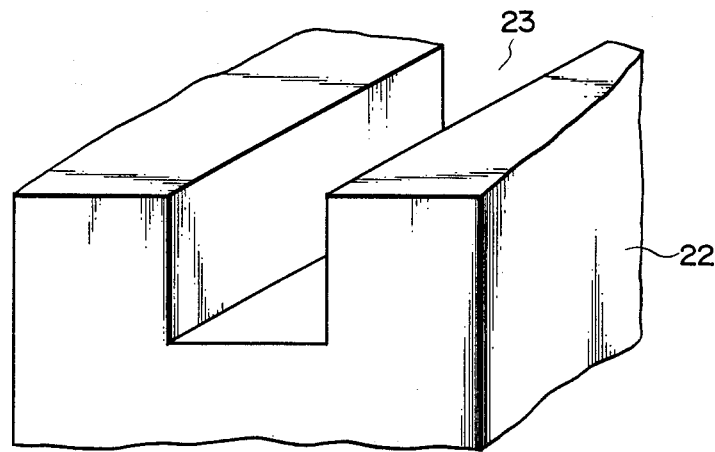
FIG. 3 is a perspective view of a substrate on which the device of FIG. 2A is fabricated.
Figure 4:
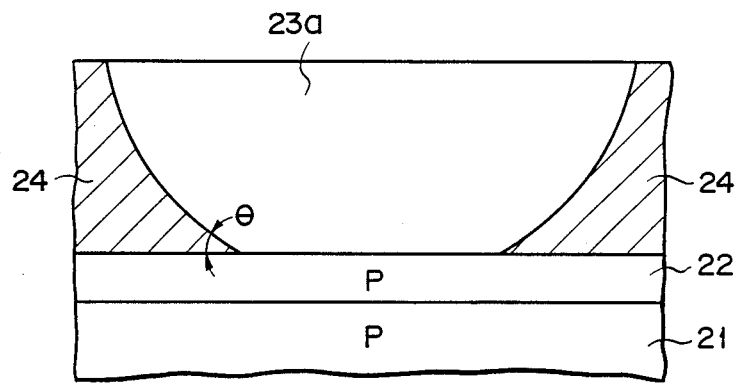
FIG. 4 is a sectional view of a substrate on which the device of FIG. 2A is produced.

As shown in these drawings, a P-well region 22 is formed on a P-type silicon substrate 21. In P-well region 22, a groove 23 is formed to extend in a predetermined direction as shown in FIG. 3. The side walls of groove 23 are formed perpendicular to the surface of P-well region 22. A silicon dioxide layer 24 is selectively embedded in groove 23 as shown in FIG. 4. As a result, groove 23 is separated into a plurality of portions 23a by silicon dioxide layer 24 and P-well region 22. As shown in FIG. 4, the lower portion of silicon dioxide layer 24 embedded in groove 23 is slanted along the direction of extension of groove 23 by an angle $\theta$ below 45 degrees.

Silicon dioxide layers 25a and 25b used as first gate insulating layers are formed on side walls of groove portion 23a which are faced each other in the direction normal to the direction of extension of groove 23. Phosphorus-doped polysilicon layers 26a and 26b are provided on silicon dioxide layers 25a and 25b, respectively. Furthermore, on the surface of polysilicon layer 26a (26b) opposite to its surface contacting silicon dioxide layer 25a (25b) formed is a second gate insulating layer 30a (30b) which is comprised of three layers of a silicon dioxide layer 27a (27b), a silicon nitride layer 28a (28b) and a silicon dioxide layer 29a (29b). Phosphorus-doped polysilicon layers 31a and 31b are formed on second gate insulating layers 30a and 30b, respectively. As shown in FIG. 2A, polysilicon layers 31a and 31b are each formed to extend from groove portion 23a so that they are common to groove portion 23a and other groove portions adjacent thereto.

N-type diffusion regions 32 each serving as the source region of a MOS transistor are formed on the surface of P-well region 22, and further an N-type diffusion region 33 serving as the drain region of the MOS transistor is formed in the surface region of P well region 22 that is located at the bottom of groove portion 23a.

Moreover, a silicon dioxide layer 34 is deposited over the entire surface of P well region 22 involving the inside of groove portion 23. An opening is formed in silicon dioxide layer 34 which reaches the surface of N-type diffusion layer 33, and a polysilicon layer 35 is formed in the opening. Polysilicon layer 35 has a low resistivity because of introduction thereto of impurities at a sufficiently high concentration. Further, a silicon dioxide layer 36 is deposited on silicon dioxide layer 34 and polysilicon layer 35. An opening is formed in silicon dioxide layer 36 which reaches the surface of polysilicon layer 35, and a metal layer 37 made of Al, Si and Cu is formed in the opening. Further, a passivation layer 38 formed of PSG, SiN or the like is deposited over metal layer 37.

Within one of groove portions 23a provided in P well region 22, two floating gate electrodes of two non-volatile transistors formed of polysilicon layers 26a and 26b, and two control gate electrodes of the two non-volatile transistors formed of polysilicon layers 31a and 31b are provided. And, N-type diffusion layers 32 formed on the surface of P well region 22 serve as the source regions of the two non-volatile transistors, and N-type diffusion layer 33 formed at the bottom of groove portion 23a serve as the common drain region of the two non-volatile transistors. N-type diffusion layer 33 is connected through polysilicon layer 35 to metal layer 37 serving as the drain electrode.

Namely, with the semiconductor device as constructed above, two non-volatile transistors are formed within each of groove portions 23a. And, the source region and the drain region of each transistor are separated in the direction of depth of groove portion 23a so that there is little possibility of occurrence of leak current due to scale-down of the dimensions of transistors in two dimensions. Since two transistors are formed within each of groove portions 23a, a considerable reduction in the size of transistors will be made possible. For instance, when the same design rules are applied, the size of a cell will be reduced to about 70% of the size of a cell used in a conventional memory.

Further, since only N-type diffusion regions 32 are provided on the top of the memory cell, there is no need of allowance for the formation of device-separating regions.

With the above embodiment, polysilicon layers 26a and 26b serving as the floating gate electrodes and polysilicon layers serving as the control gate electrodes are doped with phosphorus acting as N-type impurities. Alternatively, these polysilicon layers may be doped with boron of P-type impurities.

Subsequently the method of manufacture of the semiconductor device shown in FIGS. 2A-2C will be described with reference to FIGS. 5A through 5H.

Figure 5A:
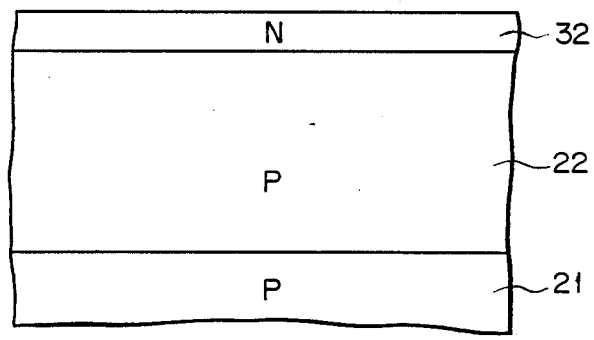
FIGS. 5A through 5H are sectional views of the device of FIG. 2A at various stages in the manufacture thereof.

First, as shown in FIG. 5A, P well region 22 is formed over the entire surface of P-type silicon substrate 21 to a thickness of about 4.5 $\mu$m.

Subsequently, As ions are implanted to the entire surface of P well region 22 at a dosage of $5 \times 10^{15}/cm^2$ to create N-type diffusion layer 32 over the surface of P well region 22.

Figure 5B:
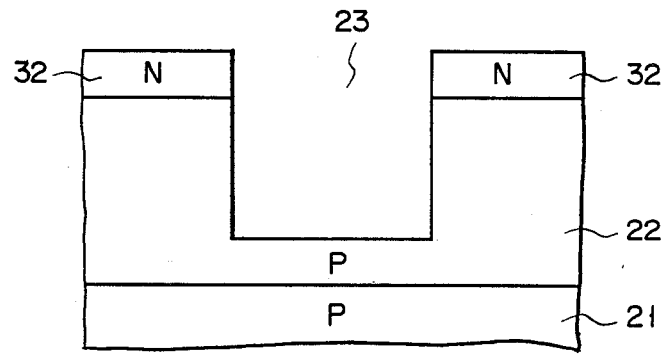

Next, as shown in FIG. 5B, groove 23 of approximate depth 1.2 $\mu$m and approximate width 1.2 $\mu$m is vertically formed in P well region 22 by RIE (reactive ion etching) technique using a proper mask. It is to be noted that in FIG. 5B groove 23 is drawn larger than its actual size, and formed to extend in a predetermined direction as shown in FIG. 3.

Figure 5C:
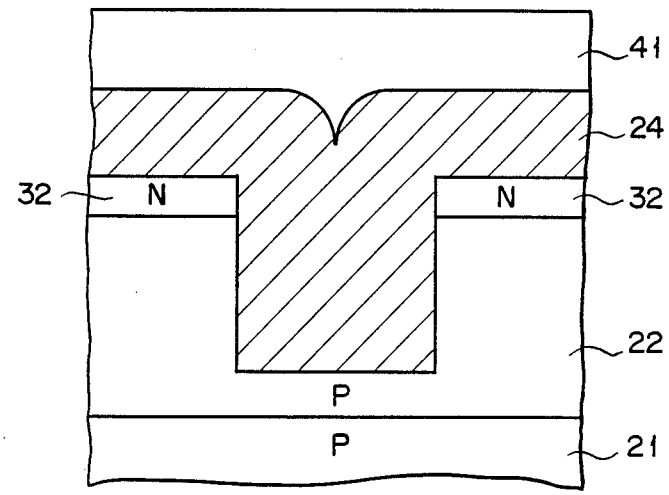

Subsequently, as shown in FIG. 5C, by using CVD process silicon dioxide layer 24 is deposited over the entire surface to a thickness of about 7000Å so that groove 23 is filled. Further, a photoresist layer 41 is deposited on silicon dioxide layer 24 to planarize the top surface of the device.

Figure 5D:
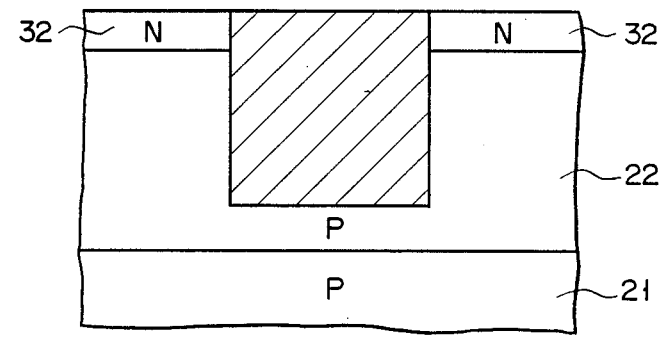

Subsequently, photoresist layer 41 and silicon dioxide layer 24 are etched away to leave silicon dioxide layer 24 only within groove 23 as shown in FIG. 5D.

Next, though not shown, a photoresist layer is formed over the entire surface of the device of FIG. 5D and then patterned to form a mask used for subsequent etching. Silicon dioxide layer 24 left in groove 23 is selectively etched away by isotropic etching, e.g., wet etching technique using the mask. As a result, as shown in FIG. 4, silicon dioxide layer 24 is selectively left inside groove 23 so that groove 23 is separated into a plurality of groove portions 23a. By isotropic-etching silicon dioxide layer 24 the lower end of silicon dioxide layer 24 left in groove portion 23a can be tapered at an angle $\theta$ below 45 degrees as shown in FIG. 4.

Figure 5E:
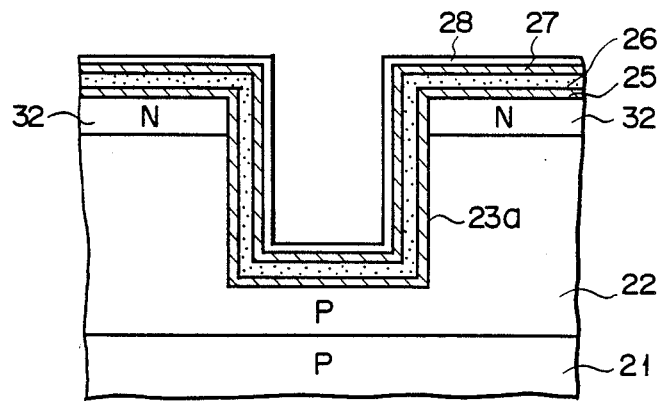

Subsequently, as shown in FIG. 5E, by thermal oxidation silicon dioxide layer 25 is formed over the entire surface including the inside surface of groove portion 23a at a thickness of 200Å, and polysilicon layer 26 doped with phosphorus is deposited by CVD on silicon dioxide layer 25 to a thickness of 1000Å. Next, silicon dioxide layer 27 of a thickness of 100Å is formed on polysilicon layer 26 by thermal oxidation, and silicon nitride layer 28 is further deposited by CVD, at a thickness of 100Å over silicon dioxide layer 27.

Figure 5F:
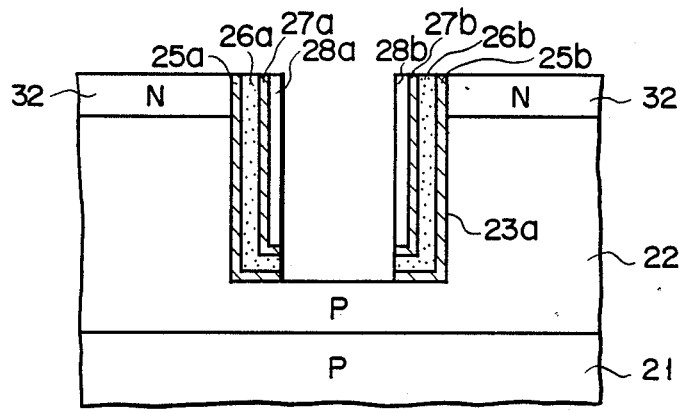

Thereafter, an etching operation is performed using anisotropic etching technique, e.g., RIE technique. As a result, as shown in FIG. 5F, silicon nitride layer 28, silicon dioxide layer 27, polysilicon layer 26 and silicon dioxide layer 25 remain only on side walls of groove portion 23a in the separate form of silicon nitride layers 28a and 28b; silicon dioxide layers 27a and 27b; polysilicon layers 26a and 26b; and silicon dioxide layers 25a and 25b. They are not left on the surface of silicon dioxide layer 24 shown in FIG. 4 and at the bottom of groove portion 23a.

Figure 5G:
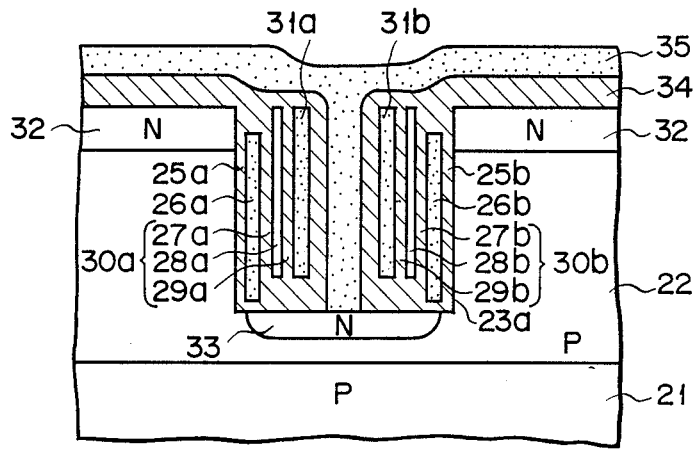

Subsequently, as shown in FIG. 5G, a silicon dioxide layer of a thickness of about 1000Å is formed only on exposed portions of polysilicon layers 26a and 26b, or the upper and lower ends thereof by heating oxidation at 900° C. At this time, thin silicon dioxide layers 29a and 29b have been formed on silicon nitride layers 28a and 28b. Then, a Phosphorus-doped polysilicon layer of about 3000Å thickness is deposited over the entire surface by CVD, and the polysilicon layer is then patterned by an anisotropic etching technique, e.g., RIE technique using a mask of a predetermined shape. The patterning process leaves polysilicon layers 31a and 31b which are used as control electrodes of non-volatile transistors for memory cells, i.e., as a word line for memory cells. Silicon dioxide layer 27a, silicon nitride layer 28a and silicon dioxide layer 29a form second gate insulating layer 30a for one non-volatile transistor, while silicon dioxide layer 27b, silicon nitride layer 28b and silicon dioxide layer 29b form second gate insulating layer 30b for the other non-volatile transistor.

Subsequently, a 850° C. heating oxidation process is carried out to form a silicon dioxide layer 34 of 2000Å thickness on the surfaces of polysilicon layers 31a and 31b and N-type diffusion region 32 utilizing a difference in impurity concentrations in silicon. At this time, a thin silicon dioxide layer is formed at the bottom of groove portion 23a to a thickness of about 500Å, for example. Thereafter, an anisotropic etching operation using a predetermined mask is carried out to remove only the thin silicon dioxide layer formed at the bottom of groove portion 23a, thereby exposing the surface of P well region 22. Subsequently, polysilicon layer 35 is deposited over the entire surface, and phosphorous is diffused at 1000° C. from the top of polysilicon layer 35 to form N-type diffusion region 33 in the surface region of P well region 22 that is located at the bottom of groove portion 23a.

Figure 5H:
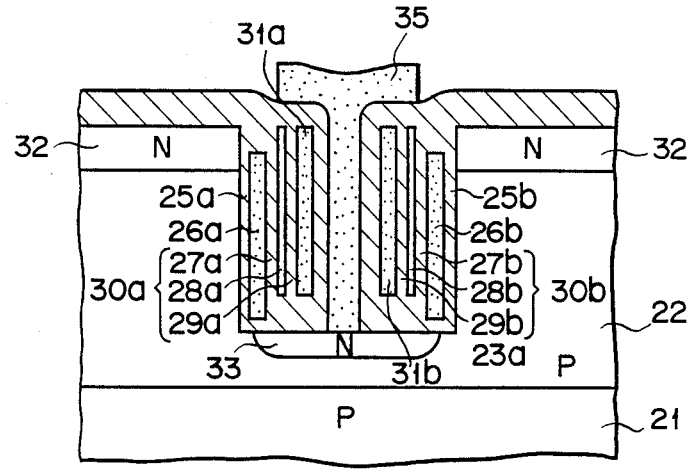

Next, as shown in FIG. 5H, by using a photolithographic masking and etching operation is carried out to leave polysilicon layer 35 at the inside of groove portion 23a and the surrounding portions thereof.

Subsequently, as shown in FIG. 2B, silicon dioxide layer 36 is deposited by CVD over the entire surface to a thickness of 6000Å, and a contact hole is then formed in silicon dioxide layer 36 to expose the surface of polysilicon layer 35. Then, a layer of an alloy of Al, Si and Cu is applied over the entire surface and patterned to form metal layer 37. Moreover, passivation layer 38 formed of PSG or SiN is deposited over the entire surface, thereby completing the device. According to the method described above, in order to separate groove 23 into groove portions 23a, groove 23 is filled with silicon dioxide layer 24 deposited by CVD and then selectively etched away. Alternatively, groove 23 may be filled with a thermal oxide layer.

Figure 6:
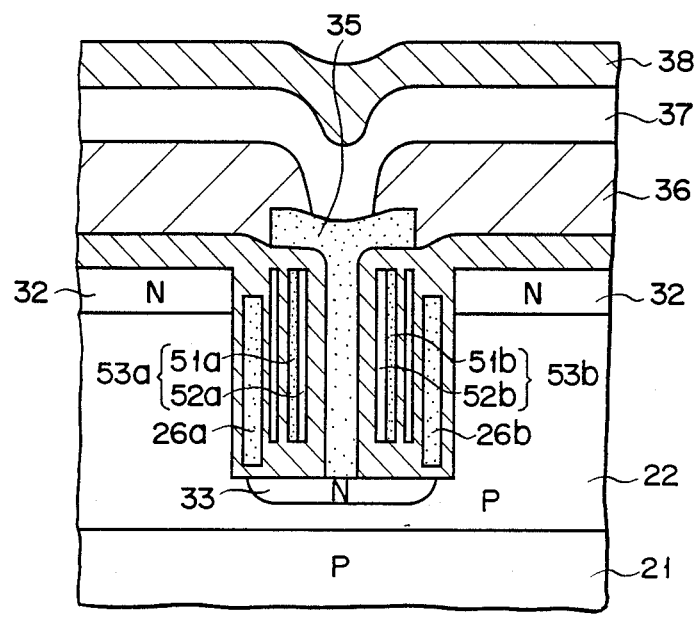
FIG. 6 is a sectional view of a transistor according to another embodiment of the invention.

With the embodiment, between polysilicon layer 26a (26b) and polysilicon layer 31a (31b) is insulating layers of so-called ONO (Oxidi-Nitride-Oxide) structure consisting of silicon dioxide layer 27a (27b), silicon nitride layer 28a (28b) and silicon dioxide layer 29a (29b). Alternatively, a thermal oxide layer, which can be formed by oxidizing the surface of the polysilicon layer 26a (26b), may be used as the second gate insulating layer. Further, polysilicon layers 26a, 26b, 31a and 31b are doped with N-type phosphorous impurities. Alternatively, they may be doped with P-type boron impurities. With the embodiment, the control gate electrodes for non-volatile transistors are each formed of a polysilicon layer. Alternatively, as shown in FIG. 6, two-layered control gate electrodes 53a and 53b may be used each of which is formed of a first layer 51a (51b) of polysilicon and a second layer 52a (52b) of a refractory metal silicide of molybdenum, tungsten, titanium or the like.

What is claimed is:

1. A non-volatile memory device comprising:
   first semiconductor region of a first conductivity type;
   a groove formed in said first semiconductor region to extend in a predetermined direction;
   insulating separation regions formed to selectively fill the inside of said groove so that said groove is divided into a plurality of groove portions;
   a second semiconductor region of a second conductivity type formed in a surface of said first semiconductor region and serving as a source region;
   a pair of first gate insulating layers formed on opposed side walls of a groove portion of said plurality of groove portions defined by said insulating separation regions and said first semiconductor region, said side walls extending along the direction of extension of said groove;

a pair of floating gate electrodes formed on surfaces of said first gate insulating layers opposite to surfaces of said first gate insulating layers contacting said side walls of said groove portion, with said floating gate electrodes having tops on a plane different from a plane of a top of said second semiconductor region;

a pair of second gate insulating layers formed on surfaces of said floating gate electrodes opposite to surfaces thereof contacting said first gate insulating layers;

a pair of control gate electrodes formed on surfaces of said second gate insulating layers opposite to surfaces thereof contacting said floating gate electrodes;

a third semiconductor region of said second conductivity type formed in a surface region of said first semiconductor region and located at a bottom of said groove portion, said third semiconductor region serving as a drain region; and a fourth semiconductor region formed within said groove portion and contacting said third semiconductor region, said fourth semiconductor region being doped with impurities of said second conductivity type.

2. A non-volatile semiconductor memory device according to claim 1, wherein said floating gate electrodes are each formed of a polysilicon layer doped with N-type or P-type impurities, and said control gate electrodes are each formed of a polysilicon layer doped with N-type and P-type impurities.

3. A non-volatile semiconductor memory device according to claim 2, wherein said floating gate electrodes are each formed of a polysilicon layer doped with N-type or P-type impurities, and said central gate electrodes are each formed of a polysilicon layer and a refractory metal silicide layer.

4. A non-volatile semiconductor memory device according to claim 1, wherein said insulating separation regions formed within said groove portion are provided with a predetermined angle of slant along the direction of extension of said groove.

5. A non-volatile semiconductor memory device according to claim 4, wherein said angle of slant is less than 45 degrees.

6. A non-volatile semiconductor memory device according to claim 1, wherein said insulating separation regions are each formed of a silicon dioxide layer.

7. A non-volatile semiconductor memory device according to claim 1, wherein said side walls of said groove portion are formed vertically with respect to the surface of said first semiconductor region.

* * * * *